(12) United States Patent
Yang et al.

(10) Patent No.: US 11,402,448 B2
(45) Date of Patent: Aug. 2, 2022

(54) MAGNETIC RESONANCE IMAGING COIL WITH SIGNIFICANTLY FEWER NUMBER OF BALUNS

(71) Applicant: Quality Electrodynamics, LLC, Mayfield Village, OH (US)

(72) Inventors: Xiaoyu Yang, Indiana, PA (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 226 days.

(21) Appl. No.: 16/802,792

(22) Filed: Feb. 27, 2020

(65) Prior Publication Data

US 2020/0278405 A1    Sep. 3, 2020

Related U.S. Application Data

(60) Provisional application No. 62/811,628, filed on Feb. 28, 2019.

(51) Int. Cl.
*G01R 33/36* (2006.01)

(52) U.S. Cl.
CPC ..... *G01R 33/3685* (2013.01); *G01R 33/3664* (2013.01)

(58) Field of Classification Search
CPC .............. G01R 33/34007; G01R 33/34; G01R 33/3415; G01R 33/365; G01R 33/3664; G01R 33/3685
USPC .......................................................... 324/322
See application file for complete search history.

(56) References Cited

U.S. PATENT DOCUMENTS

| | | | |
|---|---|---|---|
| 4,825,162 A | 4/1989 | Roemer et al. | |
| 5,910,728 A | 6/1999 | Sodickson | |
| 10,386,340 B2 | 8/2019 | Rogers et al. | |
| 2009/0021256 A1* | 1/2009 | Soutome | G01R 33/34046 324/318 |
| 2014/0167758 A1* | 6/2014 | Sambandamurthy | G01R 33/34084 324/322 |
| 2015/0168515 A1* | 6/2015 | Ishihara | A61B 5/055 324/322 |

OTHER PUBLICATIONS

Wang, Jianmin. "A Novel Method to Reduce the Signal Coupling of Surface Coils for MRI." ISMRM Annual Fourth Scientific Meeting, Apr. 27-May 3, 1996, p. 1434. vol. 1996, Issue S1, New York, New York, U.S.A., published in 1996.

* cited by examiner

*Primary Examiner* — Jermele M Hollington
*Assistant Examiner* — Courtney G McDonnough
(74) *Attorney, Agent, or Firm* — Eschweiler & Potashnik, LLC

(57) ABSTRACT

Embodiments relate to MRI coils with a reduced number of baluns. One example embodiment is a MRI coil comprising: a plurality of coil elements in one or more groups of coil elements, wherein each group of coil elements comprises at least two coil elements and a shared trace comprising portions of associated traces of each coil element of that group RF shorted together, and wherein, for each coil element of that group, the shared trace of the group is RF shorted to a shield of an associated coaxial cable for that coil element; and one or more baluns, wherein, for each group of coil elements, at least one balun of the one or more baluns is configured to mitigate leakage current on the coaxial cable of each coil element of that group of coil elements.

22 Claims, 8 Drawing Sheets

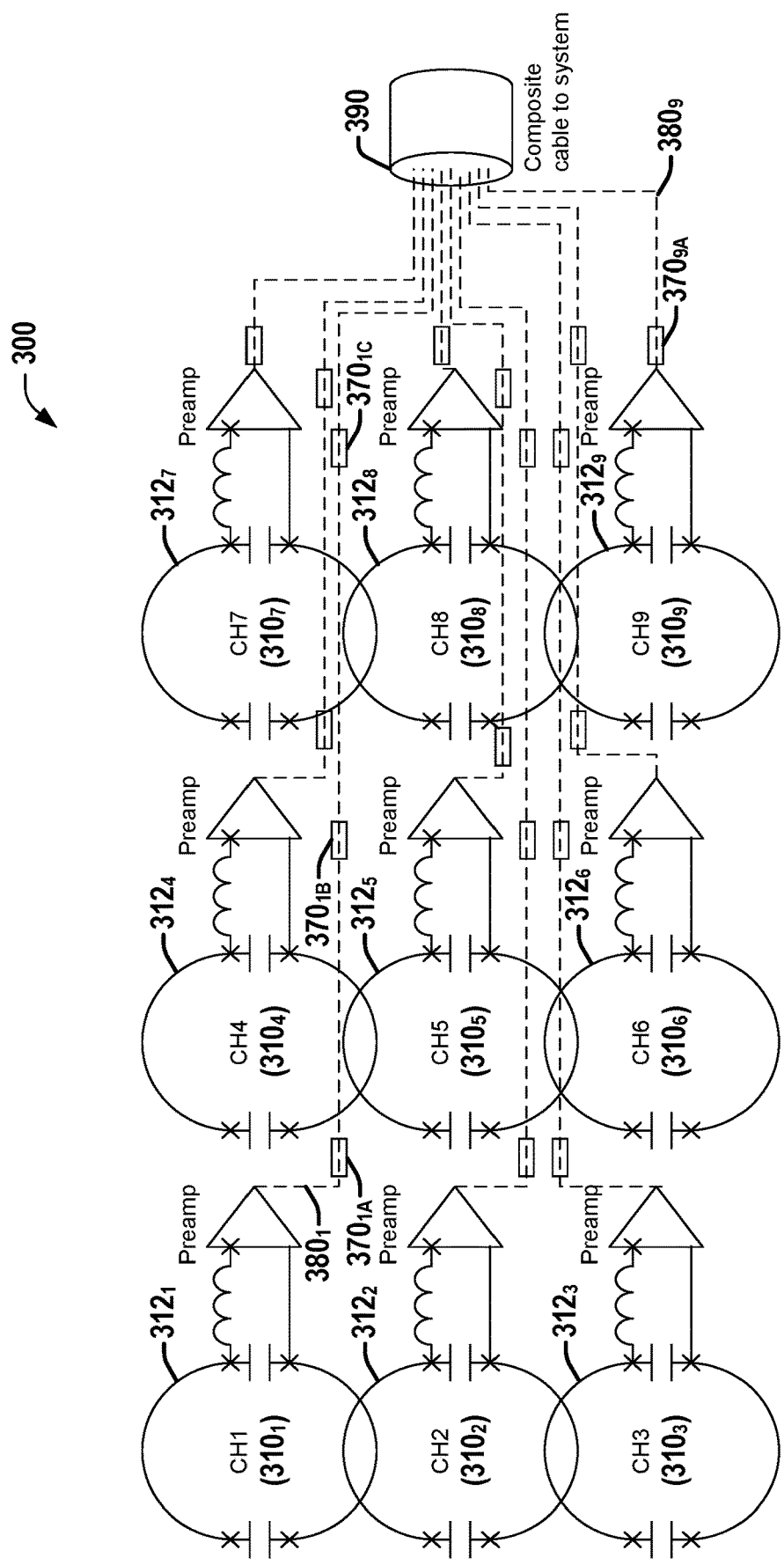

MAGNETIC RESONANCE IMAGING COIL WITH SIGNIFICANTLY FEWER NUMBER OF BALUNS

REFERENCE TO RELATED APPLICATIONS

This application claims the benefit of U.S. Provisional Patent Application No. 62/811,628 filed Feb. 28, 2019, entitled "MAGNETIC RESONANCE IMAGING COIL WITH SIGNIFICANTLY FEWER NUMBER OF BALUNS", the contents of which are herein incorporated by reference in their entirety.

BACKGROUND

Magnetic resonance imaging (MRI) involves the transmission and receipt of radio frequency (RF) energy. RF energy can be transmitted by a coil. Resulting magnetic resonance (MR) signals can also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils can create the $B_1$ field that rotates the net magnetization in a pulse sequence. RF coils can also detect precessing transverse magnetization. Thus, RF coils can be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of a RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1$H nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

BRIEF DESCRIPTION OF THE DRAWINGS

FIG. 3 is a diagram illustrating an example of a nine-element (nine channels) receiving coil, showing the complicated arrangement of coax cables and their baluns that occurs in such a situation, in connection with various aspects discussed herein.

DETAILED DESCRIPTION

Figure 1:
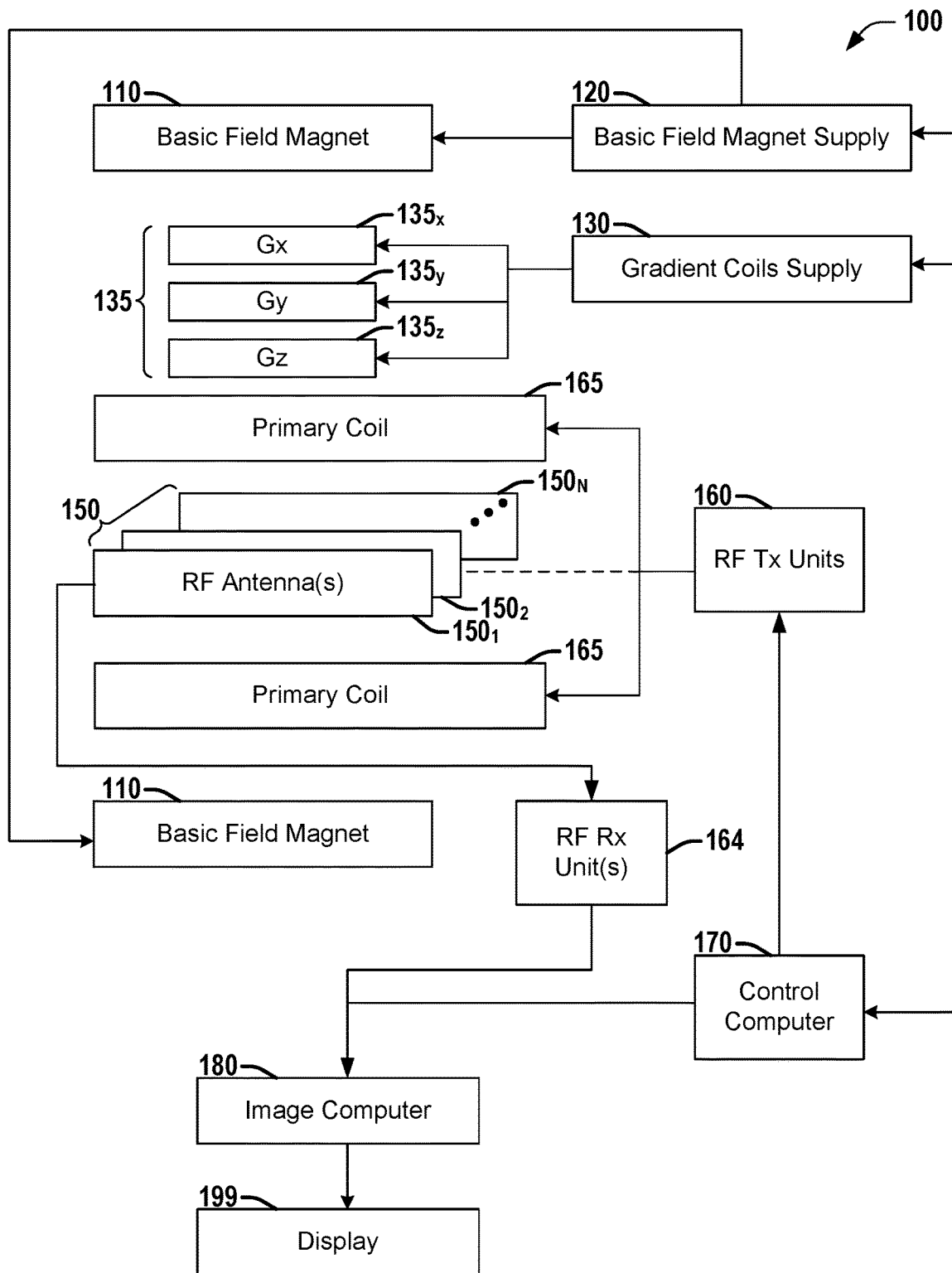
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

The present disclosure will now be described with reference to the attached drawing figures, wherein like reference numerals are used to refer to like elements throughout, and wherein the illustrated structures and devices are not necessarily drawn to scale.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during a MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

A MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

An array coil uses multiple coil elements/channels to replace one large coil element/channel. As a result, it achieves a higher signal-to-noise ratio (SNR) for surface areas while still keeping a similar SNR for deep areas. After the introduction of the array coil, parallel imaging was introduced into MRI receiving. Parallel imaging can increase scanning speed significantly at the cost of more coil elements/channels. The parallel imaging concept has also been extended to MRI transmitting coils, which can also use multiple coil elements in Tx mode. Most current state of the art MRI coils have a very high number of coil elements. For example, there are 64 channel head/neck coils at 3T, 32 channel torso coils at 3T, etc. The high number of elements/channels presents several major challenges to the MRI coil design.

Figure 2:
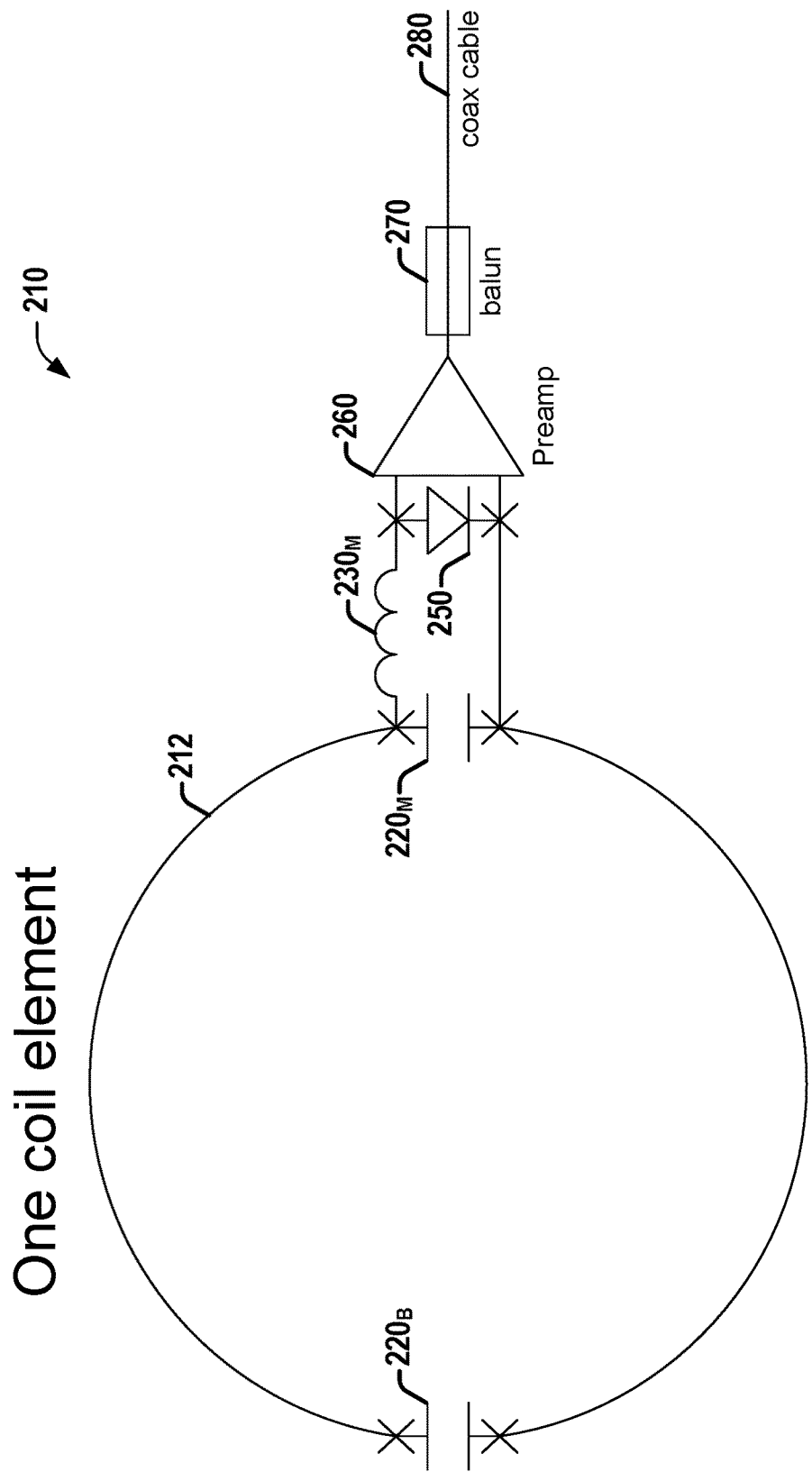
FIG. 2 is a diagram illustrating an example coil element that can be employed in or as a receive (Rx) coil, in connection with various aspects discussed herein.

Before discussing the challenges presented by a high number of channels, it is worth considering one element of a coil. Referring to FIG. 2, illustrated is a diagram of an example coil element 210 that can be employed in or as a receive (Rx) coil, in connection with various aspects discussed herein. FIG. 2 shows coil element 210, comprising wire or trace 212, matching capacitor $220_M$, capacitor $220_B$ (representing, and having equivalent capacitance to, all other capacitors (e.g., breaking point capacitors) of coil element 210), matching inductor $230_M$, preamplifier 260 which can optionally have a PIN diode 250 across it (e.g., which can decouple coil 210 and isolate preamplifier 260 in a Tx mode), one or more baluns 270, and a coaxial cable 280, which can connect coil element 210 to a MRI system (e.g., MRI system 100). For ease of illustration, associated losses (e.g., coil loss, radiation loss, patient loss) are not shown in FIG. 2, but can be represented by an equivalent resistor. The preamplifier 260 in FIG. 2 is optional, which can be put far away from the coil element 210 or in the MRI system and connected to coil element 210 (e.g., and other coil elements, etc.) through a coax cable (e.g., coax cable 280).

As can be seen in FIG. 2, each coil element (e.g., 210, etc.) has a coax cable (e.g., 280) to connect the coil element (e.g., 210) after each coil element (e.g., 210) is matched. Additionally, a cable balun (e.g., balun 270) is included for that coax cable (e.g., cable 280). The purpose of the cable balun (e.g., balun 270) is to minimize leakage of the signal of the coil element (e.g., coil element 210) through the outer surface of the shield of the coax cable (e.g., cable 280). Without a balun (e.g., balun 270), the leakage current creates coil performance degradation and there may be an unsafe large RF current flow on the cable shield (e.g., of cable 280) in transmit (Tx) mode. Although example coil element 210 is shown as a Rx coil element, various coil elements can be configured for a Rx mode, a Tx mode, or both, and an associated coax cable of that coil can be configured to carry (e.g., via the inner conductor of the coax cable) Rx signal(s) from the coil element to a MRI system, Tx signal(s) from a MRI system to the coil element, or both. The connection of coax cable (e.g., cable 280) and cable balun (e.g., balun 270) shown in FIG. 2 are also applicable to a Tx coil element.

When the number of coil elements (e.g., each of which can be similar to coil element 210) reaches a high number, then the number of coax cables (e.g., similar to coax cable 280) and baluns (e.g., similar to balun 270) on those coax cables is also a high number. Sometimes, more than one balun should be employed on a long coax cable. The routing of the coax cables and the positions and strengths of the baluns should be carefully analyzed and tested. Furthermore, the presence of many coax cables on top of coil elements decrease coil elements performance even with baluns. This is because the coax cable can still allow a very small signal current to flow with a limited strength balun.

Referring to FIG. 3, illustrated is an example of a nine-element (nine channels) receiving coil 300, showing the complicated arrangement of coax cables and their baluns that occurs in such a situation, in connection with various aspects discussed herein. In FIG. 3, each of the nine coil elements $310_1$-$310_9$ is connected via a corresponding coax cable $380_1$-$380_9$ to a MRI system (e.g., MRI system 100, for example, via composite cable 390), and each coax cable $380_1$-$380_9$ (for ease of illustration, only cables $380_1$ and $380_9$ are labeled) has one or more baluns $370_{1A}$-$370_{9A}$ (for ease of illustration, only baluns on cables $380_1$ and $380_9$ are labeled) on it to minimize signal leakage (additionally, also for ease of illustration, other elements of coil 300 (e.g., elements of channels $310_i$), some of which are illustrated, are not labeled in FIG. 3). Some coax cables (e.g., coax cable $380_9$) may have only one balun (e.g., $370_{9A}$), depending on the length and arrangement (e.g., routing of the cable, including the number of other channels crossed, etc.) of that coax cable, while other coax cables (e.g., coax cable $380_1$) can have multiple baluns (e.g., $370_{1A}$-$370_{1C}$), due to the length and arrangement (e.g., number of other channels crossed, etc.) of that coax cable. As can be seen in the example of FIG. 3 (which is still substantially simpler than, for example, a 32 or 64 channel coil), the quantity and arrangement of coax cables (e.g., $380_i$) and baluns (e.g., $370_i$) for coils with a high number of channels creates three major challenges: (1) RF coil design becomes very complicated due to the number, arrangement, and management of the coax cables and baluns; (2) SNR performance degrades; and (3) cost increases, as a result of building the many baluns.

In contrast to existing systems, various embodiments can employ techniques discussed herein to reduce the total number of baluns employed in MRI coil(s) employing multiple (e.g., a high number of) elements. In various embodiments, a MRI coil according to various embodiments discussed herein can be a Tx coil and/or a Rx coil and/or a single layer coil configured to operate alternately in both a Tx mode or a Rx mode (e.g., such as the single layer technology (SLT) and/or single layer coil(s) discussed in greater detail in co-owned U.S. patent application Ser. No. 15/583,345, entitled "SINGLE LAYER MAGNETIC RESONANCE IMAGING TRANSMIT/RECEIVE RADIO FREQUENCE COIL" (published as U.S. Pre-Grant Pub. No. 2018/0081005), the entirety of which is incorporated herein by reference). By reducing the number of baluns via techniques discussed herein, various embodiments overcome the major challenges faced by existing systems mentioned above, providing multiple advantages, such as: (1) reduced complexity of RF design compared to existing systems, (2) improved SNR performance compared to existing systems, and (3) reduced cost compared to existing systems.

Figure 4A:
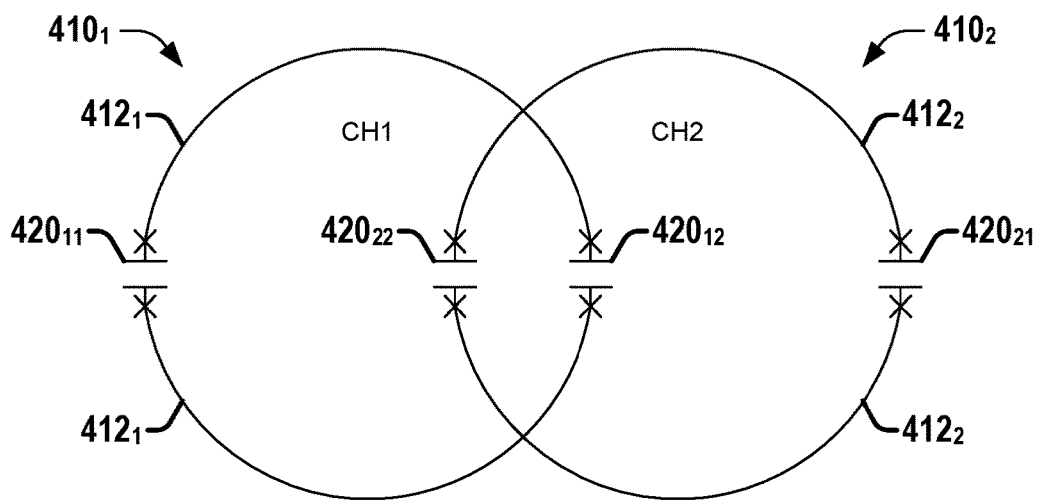
FIG. 4A is a diagram illustrating two circular loops of coil elements with partial overlap, in connection with various aspects discussed herein.
Figure 4B:
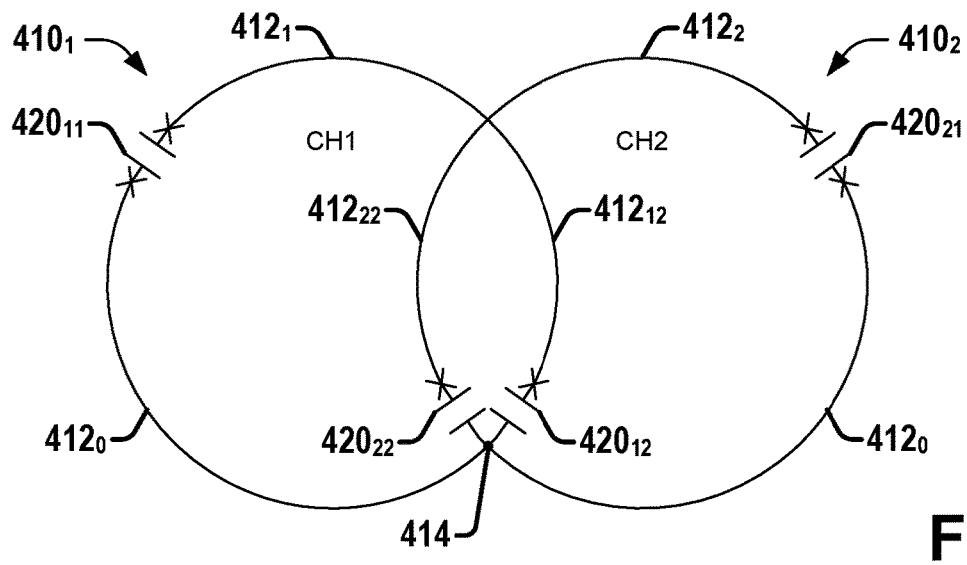
FIG. 4B is a diagram illustrating two circular loops of coil elements with partial overlap and one side electrically joined together, in connection with various aspects discussed herein.
Figure 4C:
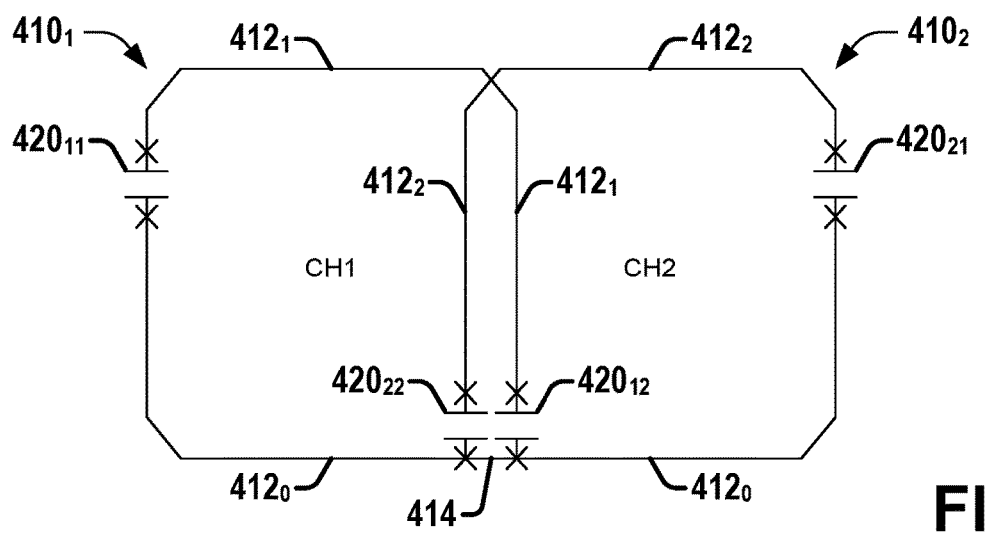
FIG. 4C is a diagram illustrating two rectangular loops of coil elements with partial overlap and one side electrically joined together similarly to FIG. 4B, in connection with various aspects discussed herein.

A first technique employed herein to reduce the number of baluns used in a multi-channel coil is discussed in connection with FIGS. 4A-4C. Referring to FIG. 4A, illustrated are two circular loops of coil elements $410_1$ and $410_2$ with partial overlap, in connection with various aspects discussed herein. Referring to FIG. 4B, illustrated are two circular loops of coil elements $410_1$ and $410_2$ with partial overlap and one side electrically joined together, in connection with various aspects discussed herein. Referring to FIG. 4C, illustrated are two rectangular loops of coil elements $410_1$ and $410_2$ with partial overlap and one side electrically joined together similarly to FIG. 4B, in connection with various aspects discussed herein. In each of FIGS. 4A-4C, capacitors of each coil element $410_i$ are shown (e.g., $420_{ij}$, e.g., which can represent break point capacitors, matching capacitors, etc., and wherein index i indicates the coil element $410_i$ comprising that capacitor), along with the wire or trace $412_i$ forming the loop of that coil element $410_i$. Although omitted for ease of illustration, other elements not shown in FIG. 4 can be included or employed in connection with coil elements $420_{Mi}$ (e.g., elements corresponding to those shown in FIG. 2, etc.).

FIGS. 4A-4C show three configurations of two channels $410_1$ and $410_2$ that use overlap to achieve isolation between direct neighbors.

In FIG. 4A, channels $410_1$ and $410_2$ use overlap to achieve isolation, similarly to existing systems. Channel $410_1$ comprises copper trace (etc.) $412_1$, and channel $410_2$ comprises copper trace (etc.) $412_2$. Copper traces (etc.) $412_1$ and $412_2$ are not electrically joined together at their cross points; instead, they are electrically insulated and the two elements are coupled through mutual inductance. Good channel isolation can be achieved by adjusting the overlap area of channels $410_1$ and $410_2$ using existing techniques. Capacitors $420_{11}$ and $420_{12}$ represent the breaking point (etc.) capacitors of channel $410_1$, and capacitors $420_{21}$ and $420_{22}$ represent the breaking point (etc.) capacitors of channel $410_2$.

FIG. 4B shows another way to use overlap to achieve good isolation. There are two differences between FIGS. 4A and 4B. The first difference is that one of the cross points (node 414) is electrically connected. The second difference is that capacitors $420_{21}$ and $420_{22}$ of channels $410_1$ and $410_2$, respectively, that were near the overlap area have been moved closer to the joined point (node 414) so that one of the terminals of each of capacitors $420_{21}$ and $420_{22}$ can be soldered to the joined point (node 414). At the other (upper) cross point of channels $410_1$ and $410_2$, the channels are still insulated from each other. The configuration of FIG. 4B can still achieve good isolation by adjusting the overlap area. The lower side trace (etc.) is labeled $412_0$ in FIG. 4B, because the copper traces (etc.) of the two channels $410_1$ and $410_2$ are connected as one longer copper trace (etc.) $412_0$, in contrast to the separate traces (etc.) $412_1$ and $412_2$ in the corresponding location in FIG. 4A.

FIG. 4C is similar to FIG. 4B, but with channels $410_1$ and $410_2$ having a rectangular channel shape instead of the circular shape shown in FIG. 4B. In various embodiments, any of a variety of shapes can be employed for a coil element or channel of an embodiment discussed herein, including regular shapes (e.g., triangular, pentagon-like, etc.) or irregular shapes (e.g., saddle-like, etc.). Although, for ease of illustration, a rectangular shape or circular shape is used in the Figures, it is to be appreciated that the techniques discussed herein can be employed in connection with any of a variety of different shapes. In both FIGS. 4B and 4C, and in connection with any other coil element shapes, the two channels can share one connected copper trace (etc.) $410_0$ through one joined point (node 414), and can have appropriately selected overlap to achieve good isolation.

Figure 5:
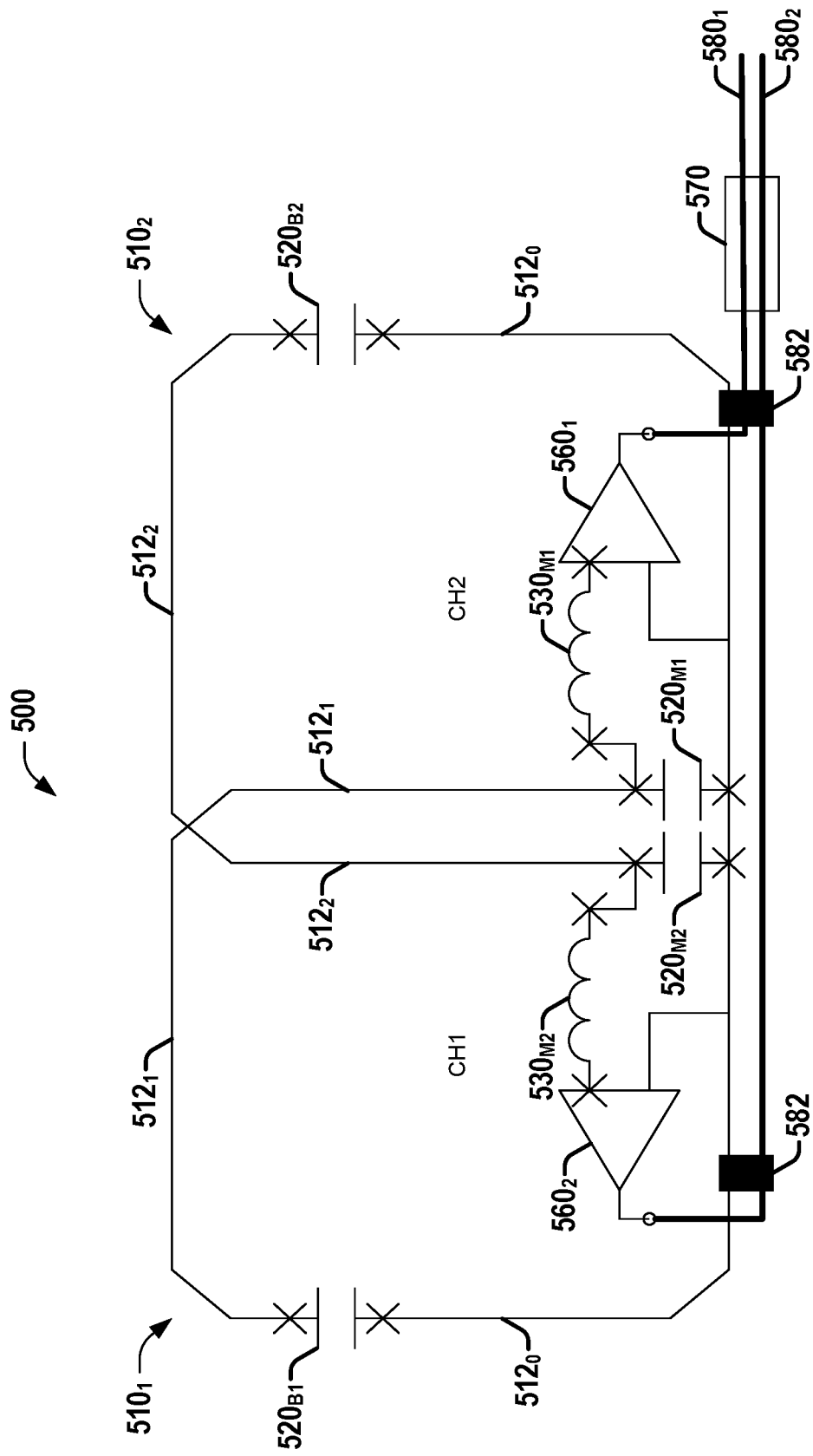
FIG. 5 is a diagram illustrating an example embodiment of a two-channel coil employing a shared balun, according to various embodiments discussed herein.

Referring to FIG. 5, illustrated is a diagram of an example embodiment of a two-channel (channels $510_1$ and $510_2$) coil 500 employing a shared balun 570, according to various embodiments discussed herein. In FIG. 5, for ease of illustration, only two channels (channels $510_1$ and $510_2$) are shown, to discuss techniques that can be employed in connection with various embodiments. Various embodiments comprising more than two channels, and different techniques that can be employed (e.g., separately or in combination) for arranging those channels and associated balun(s), are discussed in greater detail below.

In FIG. 5, capacitors $520_{M1}$ and $520_{M2}$ are the matching capacitors of channels $510_1$ and $510_2$, respectively. Capacitors $520_{B1}$ and $520_{B2}$ represent the breakpoint capacitors of channels $510_1$ and $510_2$, respectively. The inductors $530_{M1}$ and $530_{M2}$ connecting to capacitors $520_{M1}$ and $520_{M2}$, respectively, are the matching inductors of channels $510_1$ and $510_2$, respectively. Preamplifiers $560_1$ and $560_2$ amplify the signals from channels $510_1$ and $510_2$, respectively (switches (e.g., PIN diodes, etc.) which can isolate the preamplifiers $560_1$ and $560_2$ are not shown, but can be included in various embodiments). Additionally, although a specific arrangement of elements is shown in FIG. 5 for coil elements $510_1$ and $510_2$ (and for other coil elements in other Figures) for purposes of illustration, it is to be appreciated that specific arrangement of elements can vary (e.g., omitting one or more elements, including one or more additional elements, etc.), and any of a variety of designs for Tx, Rx, and/or single layer coil elements can employ techniques discussed herein.

In FIG. 5, the thicker lines with small circles at one end $580_1$ and $580_2$ represent coax cables $580_1$ and $580_2$ at the outputs of the preamplifiers $560_1$ and $560_2$, respectively. Coax cables $580_1$ and $580_2$ can transfer the signals from coil elements $510_1$ and $510_2$ to the MRI system. The preamplifiers $560_1$ and $560_2$ are optional; alternatively, preamplifiers can be put far away from the coil or at the system side. In embodiments with no preamplifiers $560_1$ and $560_2$, the center pins of coax cables $580_1$ and $580_2$ can be connected to the matching inductors $530_1$ and $530_2$, respectively. The black boxes 582 represent that shields of coax cables $580_1$ and $580_2$ and coil copper trace (etc.) $510_0$ can be RF shorted. Although two black boxes 582 are shown in FIG. 5, the specific number can vary (e.g., any positive integer), as long as it is sufficient to ensure that the shields of coax cables $580_1$ and $580_2$ are connected to the shared copper trace (etc.) $512_0$. RF shorting, as used herein, comprises either directly electrically connecting (e.g., wherein the shield(s) of coax cable(s) $580_i$ are soldered to the shared copper trace (etc.) $512_0$, etc.) or connecting in a manner that shorts RF but not DC (e.g., wherein DC block capacitor(s) (RF short(s)) to connect shield(s) of cable(s) $580_i$ to the shared copper trace (etc.) $512_0$. The trace (etc.) used for Channel $510_1$ (or $510_2$) can comprise a trace portion $512_1$ (or $512_2$) that is unique to channel $510_1$ (or $510_2$), and part of a shared trace $512_0$ that can be formed by RF shorting (e.g., as discussed herein, for example, via electrical connection or DC block capacitor, etc.) traces of what would otherwise be separate channels $510_1$ and $510_2$.

Since the shields of coax cables $580_1$ and $580_2$ are connected to the shared copper trace (etc.) $510_0$, then both channels $510_1$ and $510_2$ cannot detect the presence of the coax cables $580_1$ and $580_2$ in RF. Therefore, the cables $580_1$ and $580_2$ effectively do not exist around the area of coil elements $510_1$ and $510_2$ from the viewpoint of their effect on RF. Thus, there is no balun needed to minimize leakage between channels $510_1$ and $510_2$, and the coax cables $580_1$ and $580_2$ will not decrease the performance of coil 500. Instead of multiple baluns for the multiple channels (as in existing systems), coil 500 can comprise a common balun 570 (e.g., a single common balun, or two or more common baluns in series and/or in parallel) that can block RF leakage current from channels $510_1$ and $510_2$ together to the MRI system connection. Thus, example coil 500 successfully reduces the number of baluns from two to one (common balun 570) for a two-channel coil and the coil coax cables $580_1$ and $580_2$ become invisible to the coil 500.

Figure 6:
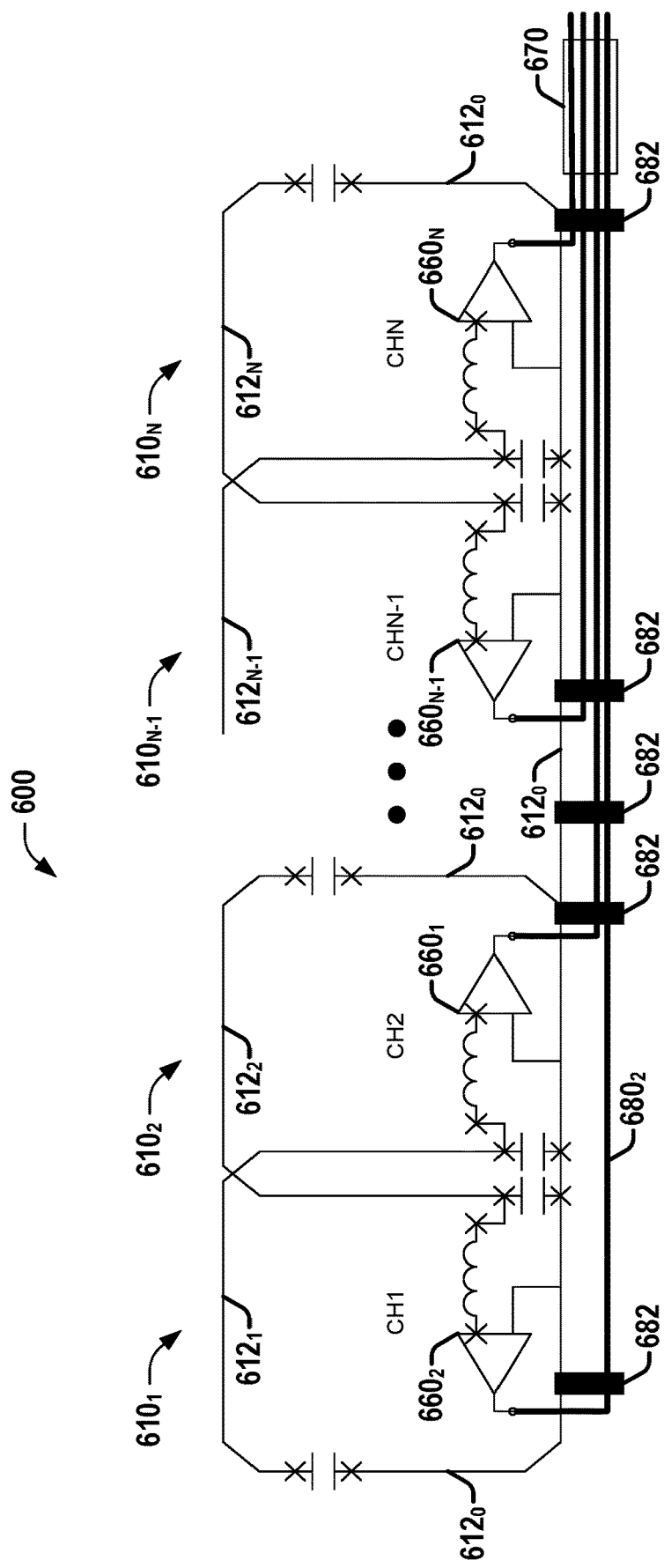
FIG. 6 is a diagram illustrating an example embodiment of an N channel coil employing a shared balun, according to various embodiments discussed herein.

In various embodiments, the approach of FIG. 5 can be extended to more than two channels. Referring to FIG. 6, illustrated is a diagram of an example embodiment of an N channel (channels $610_1$-$610_N$) coil 600 employing a shared balun 670, according to various embodiments discussed herein. All N channels $610_1$-$610_N$ in coil 600 share one common copper trace (etc.) $612_0$ through the joined points of overlaps between neighboring coil elements $610_1$-$610_N$. All the shields of the coax cables $680_i$ for each channel $610_i$ can be connected to the shared trace (etc.) $612_0$ from an RF perspective (e.g., wherein the shield of that coax cable $680_i$ is RF shorted to (as used herein) the shared trace (etc.) $612_0$). In coil 600, all of the coax cables $680_1$-$680_N$ can employ just one shared balun 670 when they exit from the whole coil 600 to the system side (alternatively, balun 670 can comprise two or more baluns in series and/or in parallel (e.g., two or more in series, two or more in parallel, two or more in series (or parallel) in parallel (or series) with at least one other, etc.). This reduces the number of baluns from N or more baluns (e.g., each row of a coil arranged as in FIG. 2 has N(N+1)/2 baluns $270_i$ for the N channels $210_i$ of the row, etc.) to a shared balun 670, and all coax cables $680_1$-$680_N$ are invisible to the coil elements $610_1$-$610_N$ from an RF perspective.

Additionally, although coil elements $610_1$-$610_N$ are shown arranged in a line in FIG. 6, it is not necessary for the N-channel coil 600 to be arranged in a line. FIG. 6 is only one representative diagram showing a possible arrangement of coil elements $610_1$-$610_N$. The N-channel coil 600 can have coil elements $610_1$-$610_N$ arranged into one or more rows, one or more columns, one or more shifted rows, and/or one or more shifted columns, which can be arranged either in an open shape configuration (e.g., such as a semi-flat torso coil, a flat spine coil, a c-shape shoulder coil, etc.) or in a closed shape configuration (e.g., such as a cylindrical-shaped knee coil, a dome-shaped head coil, an elliptical-shaped wrist coil, etc.). Various embodiments can have substantially any geometric arrangement of coil elements $610_1$-$610_N$ and still employ a reduced number of baluns by using overlap between coil elements $610_i$ to join part of the copper trace (etc.) $612_i$ of each channel $610_i$ together to form a long common copper trace (etc.) $612_0$, and use overlap between directly neighboring channels $610_i$ to achieve optimum isolations between those neighbors while still maintaining the independent RF current flow of each channel $610_i$. By connecting (e.g., via RF shorting) the shield of the coax cable $680_i$ of each of the channels $610_i$ to that long common trace (etc.) $612_0$, all of the coax cables $680_1$-$680_N$ can be made invisible (from an RF perspective) to the coil elements $610_1$-$610_N$.

Depending on the size of coil elements $610_1$-$610_N$ and coil 600, the shared long trace (etc.) $612_0$ can potentially be too long. For example, shared trace (etc.) $612_0$ can potentially resonate with the parasitic capacitance among traces (etc.) $612_i$ or disturb the Whole Body Coil (WBC) in Tx mode. If the parasitic resonant frequency of shared trace (etc.) $612_0$ is close to the working frequency, then it will disturb the coil elements $610_1$-$610_N$ around the shared trace (etc.) $612_0$. The possibility of this situation may increase at high frequency or high magnetic field ($B_0$) strength.

In various embodiments, to address this issue, the shared trace (etc.) can be broken into two or more sections, such that its parasitic resonant frequency is moved very far away from the working frequency. In various embodiments, one (or a combination of both) of two main approaches can be employed to break the shared trace (etc.), wherein each of the two or more sections can be connected to each other based on one or more of what are referred to herein as a star topology or a daisy chain topology.

Figure 7:
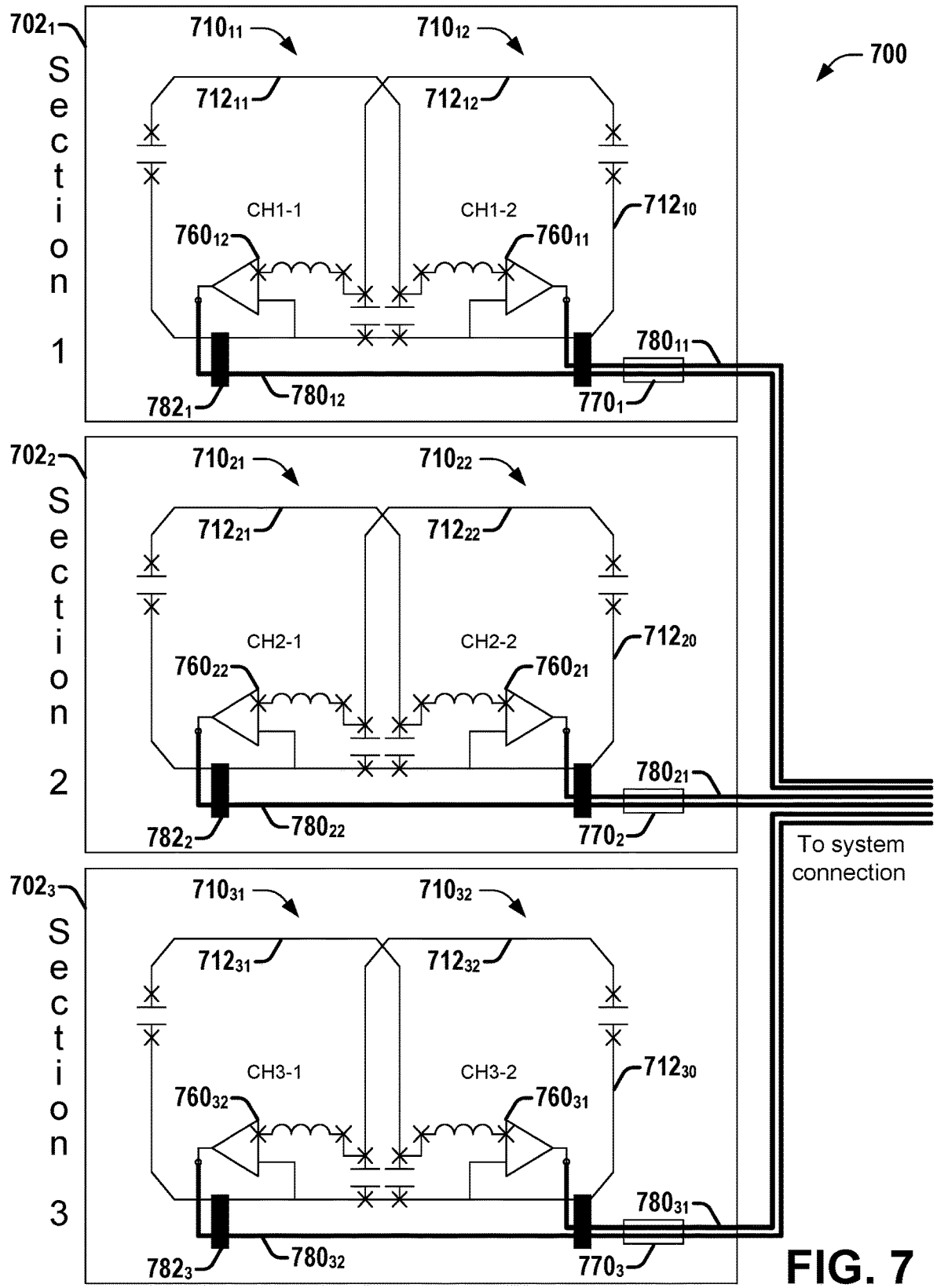
FIG. 7 is a diagram illustrating an example embodiment of a multiple channel coil employing a star topology to connect different sets of coil elements of the coil, according to various embodiments discussed herein.

The first approach is to break the shared trace into a star topology. Referring to FIG. 7, illustrated is a diagram of an example embodiment of a multiple channel coil 700 employing a star topology to connect different sets $702_i$ of coil elements $710_{ij}$ of the coil 700, according to various embodiments discussed herein. Compared to the shared long trace (etc.) $612_0$ of FIG. 6, FIG. 7 shows a trace (etc.) split into three sections ($712_{10}$, $712_{20}$, and $712_{30}$, wherein the first subscript index indicates the corresponding set $702_i$ of coil elements $702_i$ of coil 700). Although FIG. 7 shows an example with three shared trace (etc.) sections $712_{i0}$ connecting channels $710_{ij}$ of three sets $702_i$, in various embodiments, the star topology can be employed for any number N of distinct sections $712_{i0}$, where N is an integer greater than one.

In FIG. 7 and other embodiments employing the star topology, each section $712_{i0}$ and corresponding set $702_i$ has its own shared balun $770_i$ (e.g., a single balun, or two or more baluns in series and/or in parallel) for that set $702_i$. For ease of illustration, in FIG. 7, each section $712_{i0}$ connects the same number of coil elements $710_{ij}$ (although this can vary in various embodiments), which in FIG. 7 is only two channels $710_{i1}$ and $710_{i2}$ (although this number can be any positive integer in various embodiments) for each section $712_{i0}$. After the shared baluns $770_i$, all of the coax cables $780_{ij}$ can be bundled together and connected to the MR system. In some embodiments, for example, if the bundled cable is long or still on top of the coil elements, one or more additional baluns (not shown) can be employed to minimize or stop leakage current flow of the long bundled cables $780_{ij}$. In FIG. 7, each of the different sections $712_{i0}$ is a single electrically connected trace (etc.) common to each channel $710_{ij}$ of that set $702_i$, but different sections $712_{i0}$ need not be electrically connected to each other or RF shorted to each other. Additionally, as with FIGS. 5 and 6, substantially any geometric arrangement (e.g., one or more rows or portions thereof and/or one or more columns or portions thereof, open or closed shape configurations, etc.) of channels $710_{ij}$ can be employed in connection with the star topology.

Figure 8:
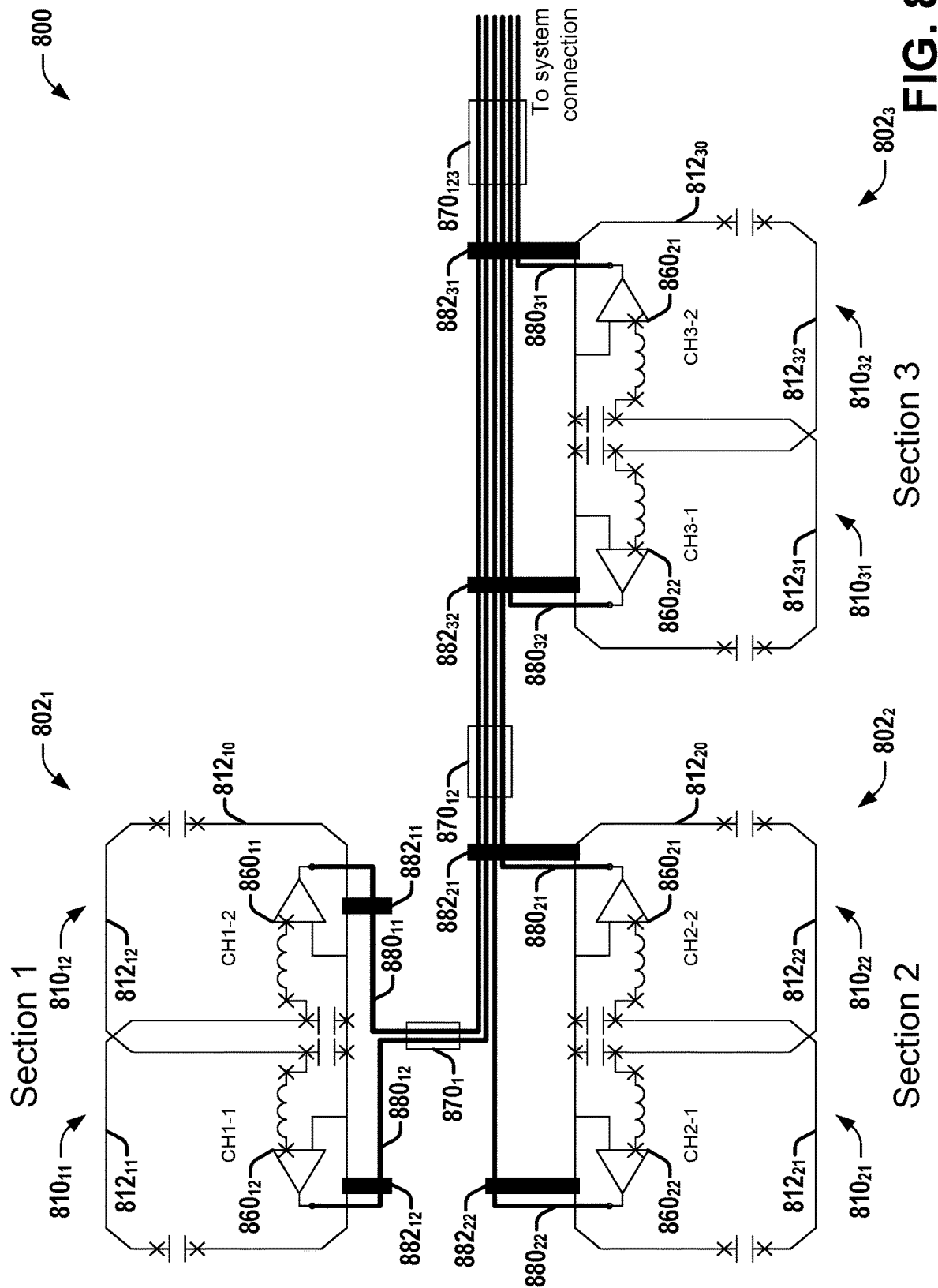
FIG. 8 is a diagram illustrating an example embodiment of a multiple channel coil employing a daisy chain topology to connect different sets of coil elements of the coil, according to various embodiments discussed herein.

The second approach is to break the shared trace into a daisy chain topology. Referring to FIG. 8, illustrated is a diagram of an example embodiment of a multiple channel coil 800 employing a daisy chain topology to connect different sets $802_i$ of coil elements $810_{ij}$ of the coil 800, according to various embodiments discussed herein. Compared to the shared long trace (etc.) $612_0$ of FIG. 6, FIG. 8 shows a trace (etc.) split into three distinct sections ($812_{10}$, $812_{20}$, and $812_{30}$, wherein the first subscript index indicates the corresponding set $802_i$ of coil elements $802_i$ of coil 800). Although FIG. 8 shows an example with three shared trace (etc.) sections $812_{i0}$ connecting channels $810_{ij}$ of three sets $802_i$, in various embodiments, the daisy chain topology can be employed for any number N of distinct sections $812_{i0}$, where N is an integer greater than one.

In FIG. 8 and other embodiments employing the daisy chain topology, the "top" of a daisy chain topology can refer to a point at which all coax cables $880_{ij}$ of the daisy chain connect to other portions of a MRI system (e.g., system 100) or of a coil (e.g., one having a more complex topology, as discussed below). In FIG. 8, the "top" of the daisy chain topology is on the right-hand side, labeled "To system connection." Similarly, "up" a daisy chain topology is in a direction toward the "top" of the daisy chain topology (in terms of the topology and circuit path, independent of the geometric arrangement of elements), and "down" a daisy chain topology is in the opposite direction from "up" a daisy chain topology, and (unless otherwise specified) toward the last or bottom set on the daisy chain (e.g., the set that is the only set down from a point where that set joins the daisy chain). In Rx mode (e.g., for Rx-only coils or other coils (e.g., single layer, etc.) having a Rx mode), signals received at coil elements (e.g., channel(s) $810_{ij}$) from relaxation of excited nuclei can be sent up the daisy chain, and eventually to a MRI system (e.g., MRI system 100). Similarly, in Tx mode for some coils (e.g., for Tx-only coils or other coils (e.g., single layer, etc.) having a Tx mode driven by transmit circuitry (e.g., as opposed to inductive coupling)), Tx signals can be sent down the daisy chain from a MRI system, and eventually to individual channels (e.g., channel(s) $810_{ij}$). Similar terminology can be employed for other topologies discussed herein (e.g., for more complex topologies discussed below), with up and top uniquely defined for each such topology, and down specified when not otherwise clear.

In the daisy chain topology of FIG. 8, each section $812_{i0}$ and corresponding set $802_i$ has a shared balun (e.g., $870_1$, $870_{12}$, $870_{123}$, each of which can be a single balun or two or more baluns in series and/or in parallel, etc.) for that section $812_{i0}$ up the daisy chain from that set $802_i$ (e.g., but down the daisy chain from any other sets $802_i$ that are up the daisy chain from that set $802_i$) that acts as a balun for that set $802_i$ and for every other set $802_i$ that is down the daisy chain from that set $802_i$. Additionally, in addition to the shields of the coax cables $880_{ij}$ of each set $802_i$ being RF shorted to the section of shared trace (etc.) $812_{i0}$ for that set $802_i$ in a manner similar to that described in connection with FIGS. 5 and 6, in the daisy chain topology, each section $812_{i0}$ can be RF shorted at one or more points (e.g., $882_{21}$, $882_{32}$, $882_{31}$) to the shields of all other coax cables $880_i$ that are down the daisy chain from that section $812_{i0}$ (and thus, to all other sections $812_{i0}$ down the daisy chain from that section $812_{i0}$).

For ease of illustration, in FIG. 8, each section $812_{i0}$ connects the same number of coil elements $810_{ij}$ (although this can vary in various embodiments), which in FIG. 8 is only two channels $810_{i1}$ and $810_{i2}$ (although this number can be any positive integer in various embodiments) for each section $812_{i0}$. Up the daisy chain from all of the shared baluns $870_i$, all of the coax cables $880_{ij}$ can be bundled together and connected to the MR system. In some embodiments, for example, if the bundled cable is long or still on top of the coil elements, one or more additional baluns (not shown) can be employed to minimize or stop leakage current flow of the long bundled cables $880_{ij}$. In FIG. 8, each of the different sections $812_{i0}$ is a single electrically connected trace (etc.) common to each channel $810_{ij}$ of that set $802_i$, but different sections $812_{i0}$ need not be electrically connected to each other, although they are RF shorted to each other. Additionally, as with FIGS. 5-7, substantially any geometric arrangement (e.g., one or more rows or portions thereof and/or one or more columns or portions thereof, open or closed shape configurations, etc.) of channels $810_{ij}$ can be employed in connection with the daisy chain topology.

In various embodiments, in addition to the star and daisy chain topologies of FIGS. 7 and 8, respectively, more complex topologies can be employed, for example, combinations of topologies discussed herein, etc. In various aspects, the connection of N channels to a single unbroken shared trace (etc.), as in FIGS. 5 and 6, can be referred to as a linear topology (although, as discussed above, the geometric arrangement of those N channels need not be linear). In some aspects, two or more coil elements (e.g., comprising associated components, coax cables, etc.) arranged together as in FIG. 5 or 6 (e.g., according to the linear topology), alone or in connection with an associated shared balun for those two or more coil elements, can be referred to as a coil element (or channel) group or group of coil elements (or channels). As specific examples indicating some of the potential variations based on topologies discussed herein, each of the three sets of FIG. 7 or FIG. 8 can (instead of comprising a group of coil elements) comprise a star topology of three sections of two channels as shown in FIG. 7 or a daisy chain topology of three sections of two channels as shown in FIG. 8, wherein different sets can employ the same or different topologies. As a more general example of complex topologies that can be employed based on combining the example topologies discussed herein, a coil can comprise N sets connected based on one of the star topology or the daisy chain topology. Each of those N sets can be a group of $N_i$ channels (e.g., wherein the $N_i$ can be the same, as in the three sections of two channels each of FIGS. 7 and 8, or two or more sections can differ from each other), a star topology of $N_i$ subsets, or a daisy chain topology of $N_i$ subsets, where different sets of the N sets can have the same or different topologies from each other. For any set of the N sets that has a star topology or daisy chain topology, the $N_i$ subsets of that set can, like the N sets of the coil, each have a linear, star, or daisy chain topology, and if there are any subsets of those subsets (sub-subsets), they can be similarly arranged, as can any sub-sub-subsets, etc., to substantially any degree, with each such path eventually terminating in (e.g., such that going down the topology along any path eventually ends in) a coil element group (e.g., two or more coil elements connected similarly to those shown in FIGS. 5 and 6).

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises A magnetic resonance imaging (MRI) radio frequency (RF) array coil comprising: at least one group of coil elements, where each group at least contains two coil elements, where for each group there are overlaps between direct neighbors and one of the two overlap cross points is joined together either using direct solder or using DC block capacitor, where the joined points create a shared continues copper trace between the two neighbors, where the two neighboring elements signal coax cables after element matching with or without preamplifiers are bundled together and have their shields connected to the shared continuous copper trace from the RF viewpoint, where all elements in this group have a shared continuous copper trace through their direct neighboring overlaps joining points, where all element coax cables shields are shorted to the shared continuous copper trace, and where all element coax cables which are bundled and exiting the group share one group cable balun.

A second example embodiment comprises the first example embodiment, wherein the shared continuous copper trace can be broken using a DC block capacitor, which is still considered as continuous copper from RF viewpoint.

A third example embodiment comprises the first example embodiment, wherein the topology among the groups is a star topology.

A fourth example embodiment comprises the first example embodiment, wherein the topology among the groups is a daisy chain topology.

A fifth example embodiment comprises the first example embodiment, wherein the topology among the groups is a mixture of a star topology and a daisy chain topology.

A sixth example embodiment comprises the first example embodiment, wherein the group balun comprises multiple baluns either in series or in parallel which have the same purpose of breaking RF connections between the continuous traces of the different groups.

The following examples are additional embodiments.

Example 1 is a magnetic resonance imaging (MRI) radio frequency (RF) coil configured to operate in at least one of a transmit (Tx) mode or a receive (Rx) mode, the MRI RF coil comprising: at least one coil element group, wherein each coil element group of the at least one coil element group comprises: two or more coil elements of that coil element group, wherein each coil element of that coil element group comprises a trace of that coil element, one or more capacitors of that coil element, and a coaxial cable of that coil element configured to carry one or more of a Rx signal for that coil element or a Tx signal for that coil element, wherein, for each coil element of that coil element group, the trace of that coil element partially overlaps at least one other neighboring coil element of that coil element group, wherein an associated portion of the trace of each coil element of that coil element group is RF shorted together to form a shared trace for that coil element group, and wherein, for each coil element of that coil element group, a shield of the coaxial cable of that coil element is RF shorted to the shared trace for that coil element group; and at least one shared balun of that coil element group configured to mitigate leakage current on the coaxial cable of each coil element of that coil element group.

Example 2 comprises the subject matter of any variation of any of example(s) 1, wherein, for a first coil element group of the at least one coil element group, the associated portion of the trace of each coil element of that coil element group is RF shorted together via one or more DC block capacitors.

Example 3 comprises the subject matter of any variation of any of example(s) 1, wherein, for a first coil element group of the at least one coil element group, the associated portion of the trace of each coil element of that coil element group is RF shorted together via electrically connecting the associated portion of the trace of each coil element of that coil element group.

Example 4 comprises the subject matter of any variation of any of example(s) 1-3, wherein, for a first coil element of a first coil element group of the at least one coil element group, the shield of the coaxial cable of the first coil element is RF shorted to the shared trace for that coil element group via a DC block capacitor.

Example 5 comprises the subject matter of any variation of any of example(s) 1-3, wherein, for a first coil element of a first coil element group of the at least one coil element group, the shield of the coaxial cable of the first coil element is RF shorted to the shared trace for that coil element group via electrically connecting the shield of the coaxial cable of the first coil element to the shared trace for that coil element group.

Example 6 comprises the subject matter of any variation of any of example(s) 1-5, wherein, for a first coil element group of the at least one coil element group, the at least one shared balun of that coil element group is a single shared balun of that coil element group.

Example 7 comprises the subject matter of any variation of any of example(s) 1-5, wherein, for a first coil element group of the at least one coil element group, the at least one shared balun of that coil element group is two or more shared baluns of that coil element group connected in one or more of series or parallel.

Example 8 comprises the subject matter of any variation of any of example(s) 1-7, wherein the at least one coil element group comprises at least two coil element groups arranged based on a star topology, wherein, for each coil element group of the at least two coil element groups, the shields of the coaxial cables of each coil element of that coil element group are RF shorted only to each other and to the shared trace of that coil element group.

Example 9 comprises the subject matter of any variation of any of example(s) 1-8, wherein the at least one coil element group comprises at least two coil element groups arranged based on a daisy chain topology, wherein, for a first coil element group of the at least two coil element groups, the shields of the coaxial cables of each coil element of the first coil element group are RF shorted to the shields of the coaxial cables of each coil element of a second coil element group different from the first coil element group, and wherein the at least one shared balun of the first coil element group is further configured to mitigate leakage current on the coaxial cable of each coil element of the second coil element group.

Example 10 comprises the subject matter of any variation of any of example(s) 1-9, wherein the at least one coil element group comprises at least three coil element groups, wherein a first coil element group and a different second coil element group of the at least three coil element groups are arranged based on a star topology, wherein a third coil element group and a different fourth coil element group of the at least three coil element groups are arranged based on a daisy chain topology, and wherein at least one of the third coil element group or the fourth coil element group is different from both the first coil element group and the second coil element group.

Example 11 is a magnetic resonance imaging (MRI) system, comprising: a radio frequency (RF) coil configured to operate in at least one of a transmit (Tx) mode or a receive (Rx) mode, the MRI RF coil comprising: at least one coil element group, wherein each coil element group of the at least one coil element group comprises: two or more coil elements of that coil element group, wherein each coil element of that coil element group comprises a trace of that coil element, one or more capacitors of that coil element, and a coaxial cable of that coil element configured to carry one or more of a Rx signal for that coil element or a Tx signal for that coil element, wherein, for each coil element of that coil element group, the trace of that coil element partially overlaps at least one other neighboring coil element of that coil element group, wherein an associated portion of the trace of each coil element of that coil element group is electrically connected together to form a shared trace for that coil element group, and wherein, for each coil element of that coil element group, a shield of the coaxial cable of that coil element is RF shorted to the shared trace for that coil element group; and at least one shared balun of that coil element group configured to mitigate leakage current on the coaxial cable of each coil element of that coil element group.

Example 12 comprises the subject matter of any variation of any of example(s) 11, wherein, for a first coil element group of the at least one coil element group, the associated portion of the trace of each coil element of that coil element group is RF shorted together via one or more DC block capacitors.

Example 13 comprises the subject matter of any variation of any of example(s) 11, wherein, for a first coil element group of the at least one coil element group, the associated portion of the trace of each coil element of that coil element group is RF shorted together via electrically connecting the associated portion of the trace of each coil element of that coil element group.

Example 14 comprises the subject matter of any variation of any of example(s) 11-13, wherein, for a first coil element of a first coil element group of the at least one coil element group, the shield of the coaxial cable of the first coil element is RF shorted to the shared trace for that coil element group via a DC block capacitor.

Example 15 comprises the subject matter of any variation of any of example(s) 11-13, wherein, for a first coil element of a first coil element group of the at least one coil element group, the shield of the coaxial cable of the first coil element is RF shorted to the shared trace for that coil element group via electrically connecting the shield of the coaxial cable of the first coil element to the shared trace for that coil element group.

Example 16 comprises the subject matter of any variation of any of example(s) 11-15, wherein, for a first coil element group of the at least one coil element group, the at least one shared balun of that coil element group is a single shared balun of that coil element group.

Example 17 comprises the subject matter of any variation of any of example(s) 11-15, wherein, for a first coil element group of the at least one coil element group, the at least one shared balun of that coil element group is two or more shared baluns of that coil element group connected in one or more of series or parallel.

Example 18 comprises the subject matter of any variation of any of example(s) 11-17, wherein the at least one coil element group comprises at least two coil element groups arranged based on a star topology, wherein, for each coil element group of the at least two coil element groups, the shields of the coaxial cables of each coil element of that coil element group are RF shorted only to each other and to the shared trace of that coil element group.

Example 19 comprises the subject matter of any variation of any of example(s) 11-17, wherein the at least one coil element group comprises at least two coil element groups arranged based on a daisy chain topology, wherein, for a first coil element group of the at least two coil element groups, the shields of the coaxial cables of each coil element of the first coil element group are RF shorted to the shields of the coaxial cables of each coil element of a second coil element group different from the first coil element group, and wherein the at least one shared balun of the first coil element group is further configured to mitigate leakage current on the coaxial cable of each coil element of the second coil element group.

Example 20 comprises the subject matter of any variation of any of example(s) 11-17, wherein the at least one coil element group comprises at least three coil element groups, wherein a first coil element group and a different second coil element group of the at least three coil element groups are arranged based on a star topology, wherein a third coil element group and a different fourth coil element group of the at least three coil element groups are arranged based on a daisy chain topology, and wherein at least one of the third coil element group or the fourth coil element group is different from both the first coil element group and the second coil element group.

Example 21 is a magnetic resonance imaging (MRI) radio frequency (RF) coil array configured to operate in at least one of a transmit (Tx) mode or a receive (Rx) mode, the MRI RF coil array comprising: a plurality of coil elements arranged into one or more groups of coil elements, wherein each group of coil elements comprises at least two coil elements of the plurality of coil elements and a shared trace of that group of coil elements that comprises portions of associated traces of each coil element of that group of coil elements RF shorted together, and wherein, for each coil element of that group of coil elements, the shared trace of the group of coil elements is RF shorted to a shield of an associated coaxial cable for that coil element; and one or more baluns, wherein, for each group of coil elements of the one or more groups of coil elements, at least one balun of the one or more baluns is configured to mitigate leakage current on the coaxial cable of each coil element of that group of coil elements.

Example 22 comprises the subject matter of any variation of any of example(s) 21, wherein the one or more groups of coil elements comprise two or more groups of coil elements arranged based on one or more of a star topology or a daisy chain topology.

Example 23 is a MRI apparatus comprising a MRI RF coil according to any variation of any of example(s) 1-22.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, Aft AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil configured to operate in at least one of a transmit (Tx) mode or a receive (Rx) mode, the MRI RF coil comprising:
    at least one coil element group, wherein each coil element group of the at least one coil element group comprises:
        two or more coil elements of that coil element group, wherein each coil element of that coil element group comprises a trace of that coil element, one or more capacitors of that coil element, a matching inductor of that coil element, and a coaxial cable of that coil element configured to carry one or more of a Rx signal for that coil element or a Tx signal for that coil element,
        wherein, for each coil element of that coil element group, the trace of that coil element partially overlaps at least one other neighboring coil element of that coil element group and forms a loop of that coil element with the one or more capacitors of that coil element,
        wherein an associated portion of the trace of each coil element of that coil element group is RF shorted together to form a shared trace for that coil element group, and
        wherein, for each coil element of that coil element group, a shield of the coaxial cable of that coil element is RF shorted to the shared trace for that coil element group; and
    at least one shared balun of that coil element group configured to mitigate leakage current on the coaxial cable of each coil element of that coil element group;
    wherein, for a first coil element of a first coil element group of the at least one coil element group, the one or more of the Rx signal for the first coil element or the Tx signal for the first coil element passes between a center pin of the coaxial cable of the first coil element and the loop of the first coil element through the matching inductor of the first coil element, which branches off the loop of first coil element.

2. The MRI RF coil of claim 1, wherein, for the first coil element group of the at least one coil element group, the associated portion of the trace of each coil element of that coil element group is RF shorted together via electrically connecting the associated portion of the trace of each coil element of that coil element group.

3. The MRI RF coil of claim 1, wherein, for the first coil element of the first coil element group of the at least one coil element group, the shield of the coaxial cable of the first coil element is RF shorted to the shared trace for that coil element group via a DC block capacitor.

4. The MRI RF coil of claim 1, wherein, for the first coil element group of the at least one coil element group, the at least one shared balun of that coil element group is a single shared balun of that coil element group.

5. The MRI RF coil of claim 1, wherein the at least one coil element group comprises at least two coil element groups arranged based on a daisy chain topology, wherein the at least two coil element groups comprises the first coil element group, wherein, for the first coil element group of the at least two coil element groups, the shields of the coaxial cables of each coil element of the first coil element group are RF shorted to the shields of the coaxial cables of each coil element of a second coil element group of the at least two coil element groups different from the first coil element group, and wherein the at least one shared balun of the first coil element group is further configured to mitigate leakage current on the coaxial cable of each coil element of the second coil element group.

6. The MRI RF coil of claim 1, wherein the at least one coil element group comprises at least three coil element groups, wherein the at least three coil element groups comprises the first coil element group, wherein the first coil element group and a different second coil element group of the at least three coil element groups are arranged based on a star topology, wherein a third coil element group and a different fourth coil element group of the at least three coil element groups are arranged based on a daisy chain topology, and wherein at least one of the third coil element group or the fourth coil element group is different from both the first coil element group and the second coil element group.

7. The MRI RF coil of claim 1, wherein, for the first coil element of the first coil element group of the at least one coil element group, the one or more capacitors of the first coil element comprises a matching capacitor having a first terminal electrically shorted to the shared trace of the first coil element group and further having a second terminal electrically shorted to the matching inductor of the first coil element.

8. The MRI RF coil of claim 1, wherein, for the first coil element of the first coil element group of the at least one coil element group, the matching inductor of the first coil element is electrically shorted to the center pin of the coaxial cable of the first coil element.

9. The MRI RF coil of claim 1, wherein, for the first coil element of the first coil element group of the at least one coil element group, the first coil element further comprises a preamplifier through which the one or more of the Rx signal for the first coil element or the Tx signal for the first coil element pass from the matching inductor of the first coil element to the center pin of the coaxial cable of the first coil element.

10. The MRI RF coil of claim 1, wherein, for the first coil element of the first coil element group of the at least one coil element group, the matching inductor of the first coil element branches off the loop of the first coil element where the trace of the first coil element partially overlaps the at least one other neighboring coil element of the first coil element group.

11. A magnetic resonance imaging (MRI) system, comprising:
  a radio frequency (RF) coil configured to operate in at least one of a transmit (Tx) mode or a receive (Rx) mode, the MRI RF coil comprising:
  at least one coil element group, wherein each coil element group of the at least one coil element group comprises:
    two or more coil elements of that coil element group, wherein each coil element of that coil element group comprises a trace of that coil element, one or more capacitors of that coil element, and a coaxial cable of that coil element configured to carry one or more of a Rx signal for that coil element or a Tx signal for that coil element,
    wherein, for each coil element of that coil element group, the trace of that coil element partially overlaps at least one other neighboring coil element of that coil element group,
    wherein an associated portion of the trace of each coil element of that coil element group is electrically connected together to form a shared trace for that coil element group, and
    wherein, for each coil element of that coil element group, a shield of the coaxial cable of that coil element is RF shorted to the shared trace for that coil element group; and
    at least one shared balun of that coil element group configured to mitigate leakage current on the coaxial cable of each coil element of that coil element group;
  wherein a first coil element group of the at least one coil element group comprises a first coil element and a second coil element spaced from each other, and further comprises a coupling element distinct from the first and second coil elements, and wherein the coupling element is configured to short radio frequency (RF) current, while blocking direct current (DC), from the associated portion of the trace of the first coil element to the associated portion of the trace of the second coil element to form the shared trace of the first coil element group.

12. The MRI system of claim 11, wherein, for the first coil element group of the at least one coil element group, the associated portion of the trace of each coil element of that coil element group is RF shorted together via one or more DC block capacitors.

13. The MRI system of claim 11, wherein, for the first coil element of the first coil element group of the at least one coil element group, the shield of the coaxial cable of the first coil element is RF shorted to the shared trace for that coil element group via electrically connecting the shield of the coaxial cable of the first coil element to the shared trace for that coil element group.

14. The MRI system of claim 11, wherein, for the first coil element group of the at least one coil element group, the at least one shared balun of that coil element group is two or more shared baluns of that coil element group connected in one or more of series or parallel.

15. The MRI system of claim 11, wherein the at least one coil element group comprises at least two coil element groups arranged based on a star topology, wherein, for each coil element group of the at least two coil element groups, the shields of the coaxial cables of each coil element of that coil element group are RF shorted only to each other and to the shared trace of that coil element group.

16. The MRI system of claim 11, wherein the at least one coil element group comprises at least three coil element groups, wherein the at least three coil element groups comprises the first coil element group, wherein the first coil element group and a different second coil element group of the at least three coil element groups are arranged based on a star topology, wherein a third coil element group and a different fourth coil element group of the at least three coil element groups are arranged based on a daisy chain topology, and wherein at least one of the third coil element group or the fourth coil element group is different from both the first coil element group and the second coil element group.

17. The MRI system of claim 11, for each coil element of the first coil element group, the trace of that coil element and the one or more capacitors of that coil element form a closed electrical loop of that coil element, wherein the closed electrical loop of the first coil element and the closed electrical loop of the second coil element are spaced from each other, and wherein the coupling element of the first coil element group extends from the closed electrical loop of the first coil element and to the closed electrical loop of the second coil element to form the shared trace of the first coil element group.

18. The MRI system of claim 11, wherein the coupling element of the first coil element group is a capacitor.

19. The MRI system of claim 11, wherein the first coil element of the first coil element group further comprises a matching inductor and a preamplifier, wherein the trace of the first coil element and the one or more capacitors of the first coil element are electrically coupled in a closed electrical loop, wherein the matching inductor extends from the closed electrical loop to an input of the preamplifier, and wherein a center pin of the coaxial cable of the first coil element extends to an output of the preamplifier.

20. A magnetic resonance imaging (MRI) radio frequency (RF) coil array configured to operate in at least one of a transmit (Tx) mode or a receive (Rx) mode, the MRI RF coil array comprising:
  a plurality of coil elements arranged into one or more groups of coil elements, wherein each group of coil elements comprises at least two coil elements of the plurality of coil elements and a shared trace of that group of coil elements that comprises portions of associated traces of each coil element of that group of coil elements RF shorted together, and wherein, for each coil element of that group of coil elements, the shared trace of the group of coil elements is RF shorted to a shield of an associated coaxial cable for that coil element; and
  one or more baluns, wherein, for each group of coil elements of the one or more groups of coil elements, at least one balun of the one or more baluns is configured to mitigate leakage current on the coaxial cable of each coil element of that group of coil elements;
  wherein the one or more groups of coil elements comprises a first coil element group and a second coil element group, wherein the one or more baluns comprises a first balun and a second balun, wherein the first balun is shared by the coaxial cable of each coil element of the first coil element group and is spaced from the coaxial cable of each coil element of the second coil element group, and wherein the second balun is shared by the coaxial cable of each coil element of the first and second coil element groups.

21. The MRI RF coil array of claim 20, wherein the one or more groups of coil elements further comprises a third coil element group, wherein the one or more baluns further comprises a third balun, wherein the first and second baluns are spaced from the coaxial cable of each coil element of the third coil element group, and wherein the third balun is shared by the coaxial cable of each coil element of the first, second, and third coil element groups.

22. The MRI RF coil array of claim 20, wherein the associated traces of the at least two coil elements of the first coil element group form a loop for each of the at least two coil elements of the first coil element group, and wherein, for each of the at least two coil elements of the first coil element group, the loop of that coil element is configured to transmit or receive RF signals and a center pin of the associated coaxial cable for that coil element is electrically coupled to the loop of that coil element through an impedance matching circuit of that coil element, the impedance matching circuit of that coil element comprising a matching inductor branching off the loop of that coil element and a matching capacitor extending along the loop of that coil element.

* * * * *